United States Patent [19]

Königstein et al.

[11] Patent Number: 5,055,828
[45] Date of Patent: Oct. 8, 1991

[54] PARASITIC-GROUND CURRENT INDICATOR FOR ELECTRICAL SYSTEM

[75] Inventors: Dietrich Königstein, Gebenstorf; Dieter Köster, Turgi, both of Switzerland

[73] Assignee: Asea Brown Boveri Ltd., Switzerland

[21] Appl. No.: 417,300

[22] Filed: Oct. 5, 1989

[30] Foreign Application Priority Data

Oct. 14, 1988 [CH] Switzerland .................. 3854/88

[51] Int. Cl.⁵ .............................................. G08B 21/00
[52] U.S. Cl. ................................ 340/664; 340/649; 324/555
[58] Field of Search ............... 340/650, 664, 657, 649; 324/127, 529, 555, 556; 361/42, 45

[56] References Cited

U.S. PATENT DOCUMENTS

| | | | |
|---|---|---|---|
| 2,499,410 | 3/1950 | Nupp | 324/123 R |
| 4,542,302 | 9/1985 | Griffioen | 340/660 X |
| 4,768,215 | 8/1988 | Kiwaki et al. | 340/127 X |
| 4,887,029 | 12/1989 | Hemminger | 324/127 X |

FOREIGN PATENT DOCUMENTS

70835/81  2/1985  Australia .
351309   11/1986  Fed. Rep. of Germany .

OTHER PUBLICATIONS

The ARRL Handbook for the Radio Amateur, publ. American Radio Relay League, 65th Ed. 1988, pp. 8-35, 8-36.
"Radio Interference", Machlachlan et al., vol. 80, (Wireless World 1974), pp. 255-259.

*Primary Examiner*—Donnie L. Crosland
*Assistant Examiner*—Jeffery A. Hofsass
*Attorney, Agent, or Firm*—Ostrolenk, Faber, Gerb & Soffen

[57] ABSTRACT

An electrical system contains two current-fed components having respective grounded housings. Each of these components is connected via a respective conductor to a common ground point. A signal-transmitting connection galvanically connects the housings two components to each other. A parasitic-current indicator is permanently installed in the system and detects parasitic currents ($I_S$) flowing between the grounded housings and generates a warning at a predetermined signal level.

12 Claims, 1 Drawing Sheet

PARASITIC-GROUND CURRENT INDICATOR FOR ELECTRICAL SYSTEM

FIELD OF THE INVENTION

This invention relates to an electrical system having separate grounded enclosures and more specifically relates to an indicator to show parasitic ground current flow between the enclosures.

STATE OF THE ART

German Patent Publication DE 35 13 091 A1 which is owned by the assignee of the present invention shows a grounded test cell in which a current-fed instrument is tested with electromagnetic pulses. A sensor is located in the vicinity of the device to measure electrical and/or optical signals. The output of the measurement cell is connected to a grounded measuring instrument. When a shielded measurement cable is used as the signal-transmitting connection between the test cell and the measuring instrument, the shield of the measurement cable galvanically connects the grounded housing of the test cell and the grounded housing of the measuring instrument to one another. If the impedance of the measurement cable is low compared to the impedances of the ground connection lines which connect the test-cell and/or measuring instrument housings to a ground point, the measurement cable may conduct a parasitic current which could impair the transmitted measurement signal.

Clamp-on ammeters are also known and can be clamped onto a cable without interrupting the cable in the search for defects in an electrical system. Such a clamp-on meter is used with the present invention for the detection of parasitic ground currents.

DESCRIPTION OF THE INVENTION

The invention permits detection of errors in the transmission of signals between grounded but galvanically connected housings in an electrical system of the aforementioned type under different operating conditions and provides a constantly connected parasitic-current indicator suitable for such systems.

The electrical system of the invention immediately senses undesirably large parasitic current between two or more grounded housings of an electrical system and produces an output alarm of any desired nature. The system can then be corrected as by changing the ground conditions or changing the signal-transmitting galvanic connection which was found to be disturbed. These time-consuming searches for defects are eliminated by the invention. At the moment a misconnection arises, a warning is given. The parasitic-current indicator of the invention can be manufactured easily and at low cost. In general, it does not require any additional source of energy, and it requires practically no maintenance, even after many years of use.

BRIEF DESCRIPTION OF THE DRAWINGS

The invention is described in further detail below with reference to an embodiment shown in the drawings, in which.

DETAILED DESCRIPTION OF THE DRAWINGS

Figure 1:
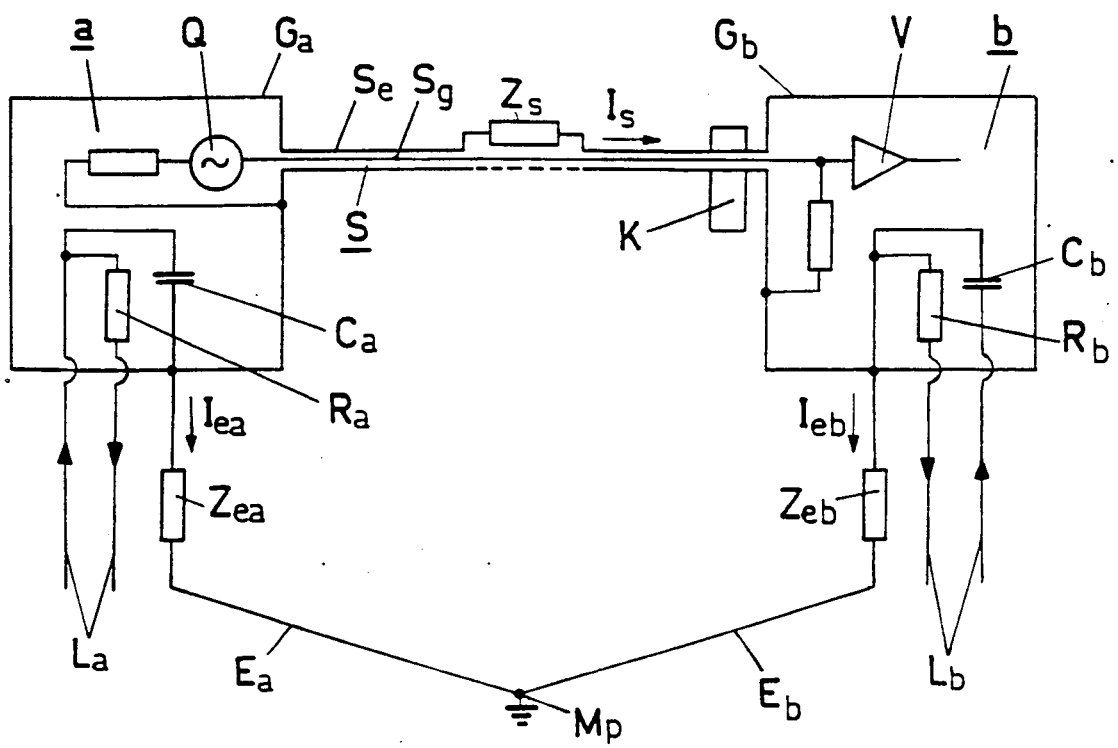
FIG. 1 is a schematic diagram of one embodiment of an electrical system according to the invention.

The electrical system shown in FIG. 1 contains two electrical component housings, a and b. Component a may, for example, be a computer in a data processing system or the test cell of a measuring device, and comprises an electrically conductive housing $G_a$ which is connected via a ground line $E_a$ to a ground point $M_p$. In a corresponding manner, component b can, for example, be peripheral data processing device or measuring instrument having an electrically conductive housing $G_b$ which is connected via line $E_b$ to the ground point $M_p$. Conductors $E_a$ and $E_b$ have impedances $Z_{ea}$ and $Z_{eb}$ respectively, which are dependent on the configuration of the electrical system.

A signal generator or source Q of any desired type is contained in the component a. Signal source Q is connected, on the one hand, via a resistor (not shown) to the housing $G_a$ and, on the other hand, to the inner conductor $S_g$ of a signal-transmitting conductor S which extends to component b. Conductor S can, for instance, be a coaxial measurement cable or a bus system having a conductive shield or sheath $S_e$. The inner conductor $S_g$ of the signal-transmitting conductor S is connected to an input of a signal output circuit V, which has one input connected to the housing $G_b$. Output circuit V can, for example, be an amplifier. Shield $S_e$ is galvanically connected to both of housing $G_a$ and $G_b$. The impedance of the conductor S is schematically shown as impedance $Z_s$.

Figure 2:
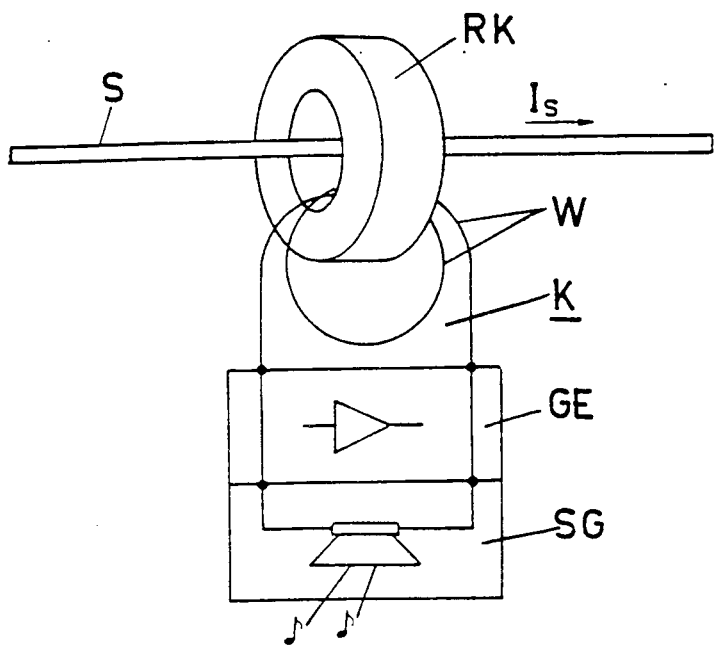
FIG. 2 is a schematic diagram of the parasitic-current indicator of the invention which is contained in the electrical system of FIG. 1.

A parasitic-current indicator K in accordance with the invention, is permanently coupled to the signal-transmitting conductor S. Parasitic-current indicator K has a sensor which detects the magnetic field created by a parasitic current in the sheath $S_e$. Sensor K, as shown in FIG. 2, can be formed by a wound annular ferromagnetic toroidal core RK. The annular core RK carries a winding W. The core can be segmented and clamped onto an original conductor S. Alternatively, the conductor S can be inserted through the center of the core before its connection to one of the housings a or b and is clamped to conductor S.

Thus the conductor S acts as the primary winding of an instrument transformer having core RK and secondary winding W. The core RK is rigidly mounted on conductor S.

The parasitic-current indicator of FIG. 2 also has a signal transmitter SG which can be activated by signals from the winding W and emits acoustical, optical or electrical alarm signals and may proportionally indicate the magnitude of the parasitic currents detected.

In one embodiment of the invention, signal transmitter SG can be a loudspeaker connected to the winding W of the sensor. It can also be a piezoelectric transducer, an optical display or a relay. As shown in FIG. 2, winding W can be coupled to signal transmitter SG via a rectifier and amplifier GE. This type circuit is used when parasitic-current indicator K is to have high sensitivity.

In FIG. 1, lines $L_a$ and $L_b$ are insulated from and are conducted through leadthroughs in housing $G_a$ and $G_b$ to loads $R_a$ and $R_b$, which may be coupled to the signal source Q and the signal drain V respectively. Parasitic signals occurring, for instance, on the connecting lines $L_a$ or $L_b$ are filtered by capacitors $C_a$ and $C_b$ respectively connected between one of the connecting lines of pair $L_a$ and $L_b$ and a corresponding one of the housing $G_a$ and $G_b$.

During the operation of such an electrical system, parasitic currents $I_S$, which may be unacceptably large, may occur in the conductor $S_g$. Thus, parasitic current will flow when the ground reference points of the signal-transmitting connector S on the housing $G_a$ and $G_b$ are of different potential and when the impedance $Z_S$ of the conductor S is small compared with the impedances $Z_{ea}$ and/or $Z_{eb}$. Such different potentials also occur when current flows over the ground conductors $E_a$, $E_b$ to the common ground point $M_p$. Such currents, designate $I_{ea}$ and $I_{eb}$ in FIG. 1, can be caused, for example, by parasitic signals such as RF signals which are coupled into systems a and b over the connecting lines $L_a$ and $L_b$ respectively. These parasitic signals are filtered out by the capacitors $C_a$ and $C_b$, and flow as current $I_{ea}$ and $I_{eb}$ over the ground/grounding lines $E_a$ and $E_b$ to the common ground point $M_p$ of the two components.

Parasitic current $I_S$ can also be induced by the coupling of electromagnetic parasitic fields into the elongated loop formed by the signal-transmitting connection S and the two ground lines $E_a$, $E_b$. Depending on the degree of coupling between the parasitic current circuit formed by the shield $S_e$ and the signal circuit formed by the inner conductor $S_g$, these parasitic currents $I_S$ can considerably affect signal transmission. This effect is particularly great in electrical systems in which the signal line galvanically connects systems a and b as is common in the case of temperature measurement systems using thermocouples.

Another problem arises because the parasitic current $I_S$ which is coupled into the signal-transmitting connection V varies as a function of load of the entire electrical system, and therefore can frequently be recognized only by chance.

By permanent provision of the parasitic-current indicator of the invention, parasitic currents $I_S$ which may occur upon the operation of the electrical system and which exceed a predetermined warning level are detected and signals related to the fault may be continuously generated.

In a preferred embodiment of the parasitic-current indicator shown in FIG. 2, ripple currents which are dependent on the supply network flow as parasitic currents $I_S$ in the conductor S. The conductor acts as the primary winding of a transformer and induces measurement currents in the winding W, which acts as the secondary winding of the transformer. These measurement currents are indicated as an amplitude-dependent audible hum by the signal transmitter SG, which is a loudspeaker. In this way, parasitic currents for example, greater than 100 mA, can be indicated in an inexpensive manner. Such apparatus requires practically no maintenance and does not require an additional current supply or rectifier, amplifier and control device connected between the winding W and the loudspeaker.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An electrical system having at least two current fed assemblies, each of which assemblies has a pair of leads extending externally thereof and each of which assemblies is connected over at least one ground conductor to a common ground point and at least one signal-transmitting galvanic conductor connecting the at least two electric assemblies together, characterized by at least one parasitic-current indicator (K) which is fixed to at least one portion of said signal-transmitting galvanic conductor for continuously detecting parasitic current in the at-least one signal-transmitting galvanic conductor.

2. The system of claim 1, wherein a first one of said at least two assemblies contains at least one filter capacitor, said at least one filter capacitor being connected between ground and said pair of leads of the first assembly.

3. The system of claim 1 wherein said parasitic-current indicator comprises at least one sensor which continuously detects parasitic currents in said at-least one signal-transmitting galvanic conductor and at least one signal transmitter which is operatively connected with an output of said sensor and indicates the magnitude of the parasitic currents detected.

4. The system of claim 3 wherein said at least one sensor comprises a transformer having a ferromagnetic core secured around said at-least one signal-transmitting conductor; said core having at least one output winding which is coupled to said signal-transmitting conductor.

5. The system of claim 4 wherein said at least one output winding is connected to the input of an indicator device.

6. The system of claim 5 wherein said indicator device is a loudspeaker.

7. The device of claim 4 wherein at least one winding is connected to amplifier means.

8. In combination, a first conductive housing for a first electrical circuit component; a second conductive housing for a second electrical circuit component; a common ground potential node; first and second conductors connecting said first and second housings respectively to said common ground potential node; a coaxial conductor comprising a central conductor for connecting said first and second electrical circuit components to one another and an outer conductive sheath connected to said first housing at one of its ends and to said second housing at its opposite end; and means for measuring current flow along the axis of said outer conductive sheath fixed to said outer sheath and constantly monitoring for the flow of current in said outer sheath and between said first and second housings; and output means coupled to said means for measuring current flow and being energized in accordance with some predetermined function of the magnitude of said current flow.

9. The combination of claim 8 wherein said current measuring means is a current transformer.

10. The combination of claim 9 wherein said outer sheath defines the primary winding of said current transformer; said current transformer having a secondary winding coupled to said output means.

11. The combination of claim 8 wherein said output means produces an audio output which has an intensity related to the current magnitude in said outer sheath.

12. The combination of claim 10 wherein said current transformer has a toroidal core which is wrapped around the outer periphery of said sheath.

* * * * *